(12) United States Patent
Shea et al.

(10) Patent No.: US 12,150,316 B2
(45) Date of Patent: Nov. 19, 2024

(54) METHOD TO INTEGRATE DC AND RF PHASE CHANGE SWITCHES INTO HIGH-SPEED SiGe BiCMOS

(71) Applicant: Northrop Grumman Systems Corporation, Falls Church, VA (US)

(72) Inventors: Patrick B. Shea, Alexandria, VA (US); Robert M. Young, Ellicott City, MD (US); Keith H. Chung, Columbia, MD (US); Andris Ezis, Ellicott City, MD (US); Ishan Wathuthanthri, Baltimore, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 74 days.

(21) Appl. No.: 17/981,744

(22) Filed: Nov. 7, 2022

(65) Prior Publication Data

US 2023/0056901 A1 Feb. 23, 2023

Related U.S. Application Data

(62) Division of application No. 16/544,212, filed on Aug. 19, 2019, now Pat. No. 11,522,010.

(51) Int. Cl.
*H10B 63/00* (2023.01)
*H01L 21/8249* (2006.01)
(Continued)

(52) U.S. Cl.
CPC ......... *H10B 63/00* (2023.02); *H01L 21/8249* (2013.01); *H10N 70/021* (2023.02);
(Continued)

(58) Field of Classification Search
CPC ..... H10B 63/00; H10B 63/30; H01L 21/8249; H10N 70/8613; H10N 70/8828;
(Continued)

(56) References Cited

U.S. PATENT DOCUMENTS 7,205,188 B2  4/2007  Knoll et al.
7,633,079 B2  12/2009  Chen et al.
(Continued)

OTHER PUBLICATIONS

El-Hinnawy et al., Improvements in GeTe-Based Inline Phase-Change Switch Technology in RF Switching Applications, CS MANTECH Conference, May 19-22, 2014, Denver, Colarado, pp. 401-404.
(Continued)

*Primary Examiner* — Vongsavanh Sengdara
(74) *Attorney, Agent, or Firm* — Dority & Manning, P.A.

(57) ABSTRACT

A method of integrating a phase change switch (PCS) into a Bipolar (Bi)/Complementary Metal Oxide Semiconductor (CMOS) (BiCMOS) process, comprises providing a base structure including BiCMOS circuitry on a semiconductor substrate, and forming on the base structure a dielectric contact window layer having metal through-plugs that contact the BiCMOS circuitry. The method includes constructing the PCS on the contact window layer. The PCS includes: a phase change region, between ohmic contacts on the phase change region, to operate as a switch controlled by heat. The method further includes forming, on the contact window layer and the PCS, a stack of alternating patterned metal layers and dielectric layers that interconnect the patterned metal layers, such that the stack connects a first of the ohmic contacts to the BiCMOS circuitry and provides connections to a second of the ohmic contacts and to the resistive heater.

11 Claims, 15 Drawing Sheets

(51) Int. Cl.
    *H10N 70/00* (2023.01)
    *H10N 70/20* (2023.01)

(52) U.S. Cl.
    CPC ......... *H10N 70/231* (2023.02); *H10N 70/826* (2023.02); *H10N 70/8413* (2023.02); *H10N 70/8828* (2023.02)

(58) Field of Classification Search
    CPC .. H10N 70/826; H10N 70/021; H10N 70/231; H10N 70/8413; H10N 70/823; H10N 70/063
    See application file for complete search history.

(56) References Cited

U.S. PATENT DOCUMENTS

| | | | |
|---|---|---|---|
| 7,634,248 | B2 | 12/2009 | Xu et al. |
| 7,846,805 | B2 | 12/2010 | Zhang et al. |
| 7,969,770 | B2 | 6/2011 | Chen et al. |
| 8,900,930 | B2 | 12/2014 | Moon |
| 9,142,546 | B2 | 9/2015 | Shea et al. |
| 9,257,647 | B2 | 2/2016 | Borodulin et al. |
| 9,293,699 | B1 | 3/2016 | Moon |
| 9,362,492 | B2 | 6/2016 | Goktepeli et al. |
| 9,368,720 | B1 | 6/2016 | Moon et al. |
| 9,673,392 | B2 | 6/2017 | Borodulin |
| 9,865,564 | B2 | 1/2018 | Cadotte et al. |
| 9,865,654 | B1 | 1/2018 | He et al. |
| 9,917,104 | B1 | 3/2018 | Roizin et al. |
| 10,186,742 | B2 | 1/2019 | Sherwin et al. |
| 10,312,580 | B1 | 6/2019 | Lan et al. |
| 2006/0113520 | A1* | 6/2006 | Yamamoto ......... H10N 70/8828 257/3 |
| 2014/0264230 | A1* | 9/2014 | Borodulin ............ H10N 70/026 257/4 |
| 2016/0079019 | A1 | 3/2016 | Borodulin et al. |
| 2017/0365427 | A1 | 12/2017 | Borodulin et al. |
| 2017/0372983 | A1* | 12/2017 | Howard ............. H01L 27/1203 |
| 2019/0067572 | A1* | 2/2019 | Tsai ................... H10N 70/8613 |
| 2020/0058861 | A1* | 2/2020 | Slovin ................. H10N 70/823 |
| 2020/0058862 | A1* | 2/2020 | Howard .............. H10N 70/011 |
| 2020/0091428 | A1* | 3/2020 | Rose .................. H10N 70/8828 |

OTHER PUBLICATIONS

Delacruz et al., Evidence of Electric Field Effect on Crystallization of GeTe RF Switches and Method to Estimate Threshold Voltage, downloaded Aug. 5, 2019, 5 pages.

Slovin et al., Measurement of Phase Change Switch Critical Quench Time and Crystallization Time, downloaded Aug. 5, 2019, 5 pages.

De La Cruz et al., Reduction of Thermal Power Consumption in GeTe RF Switches, GOMAC 2016, Orlando Florida, Mar. 14-17, pp. 1-4.

El-Hinnawy et al., Substrate Agnostic Monolithic Integration of the Inline Phase-Change Switch Technology, May 2016 IEEE International Microwave Symposium, San Francisco, California, pp. 1-4.

Champlain et al., Examination of the Temperature Dependent Electronic Behavior of GeTe for Switching Applications, AIP Journal of Applied Physics, vol. 119, 2016, pp. 244501-1-244501-8.

Xu et al., Thermometry of a high temperature high speed micro heater, vol. 87, published Online Feb. 29, 2016, pp. 024904-1-024904-8.

Borodulin et al., Recent Advances in Fabrication and Characterization of GeTe-based Phase-change RF Switches and MMICs, IEEE International Microwave Symposium, Hawaii, 2017, pp. 1-4.

Slovin et al., AlN Barriers for Capacitance Reduction in Phase-Change RF Switches, IEEE Electron Device Letters, vol. 37, No. 5, May 2016, pp. 568-571.

Singh et al., A 3/5 GHz Reconfigurable CMOS Low-Noise Amplifier Integrated with a Four-Terminal Phase-Change RF Switch, 2015 IEEE International Electron Devices Meeting (EIDM), pp. 25.3.1-25.3.4.

El-Hinnawy et al., Reconfigurable Inline Phase-Change Switches for Broadband Applications, IEEE International Microwave Symposium, Phoenix, Arizona, May 17-22, 2015, pp. 1-4.

Borodulin et al., Low-Loss, Non-volatile, Phase-Change RF Switching Technology for Rapidly Adaptable Systems, GOMAC 2015, St. Louis, Missouri, Mar. 23-26, 2015, pp. 1-5.

Ruppalt et al., Temperature-Dependent Electrical Conductivity of GeTe-Based RF Switches, GOMAC, St. Louis, Missouri, Mar. 23-26, 2015 pp. 1-4.

Ivanov et al., Power Handling of GeTe RF Switches, GOMAC 2015, St. Louis, Missouri, Mar. 23-26, 2015, pp. 1-4.

King et al., Morphological Analysis of GeTe in inline phase change switches, Journal of Applied Physics, 2015, vol. 118, pp. 094501-1-094501-8.

Borodulin et al., Low-Loss, Non-Volatile, Phase-Change RF Switching Technology for System Reconfigurability and Reliability, Proceedings SPIE Defense + Security Conference, May 5-9, 2014, paper 9096-10, Baltimore, Maryland, pp. 1-6.

El-Hinnawy et al., Low-Loss Latching Microwave Switch Using Thermally Pulsed Non-Volatile Chalcogenide Phase Change Materials, AIP Journal Applied Physics, Applied Physics Letters, 2014, vol. 105, pp. 013501-1-013501-5.

El-Hinnawy et al., 12.5 THz Fco GeTe Inline Phase-Change Switch Technology for Reconfigurable RF and Switching Applications, 2014 IEEE Compound Semiconductor IC Symposium, San Diego, California, pp. 1-3.

Young et al., Thermal Analysis of an Indirectly Heat Pulsed Non-Volatile Phase Change Material Microwave Switch, Journal of Applied Physics, vol. 116, 2014, pp. 054504-1-054504-6.

King et al., Development of cap-free sputtered GeTe Films for inline phase change switch based RF circuits, published Jun. 24, 2014, JVST B—Nanotechnology and Microelectronics: Materials, Processing, Measurement, and Phenomena, vol. 32, No. 4, pp. 041204-1-041204-5.

Lee et al., RF FPGA for 0.4 to 18 GHz DoD Multi-Function systems, GOMAC 2013, Las Vegas, Nevada, Mar. 12, 2013, pp. 1-4.

El-Hinnawy et al., A 7.3 THz Cut-Off Frequency, Inline, Chalcogenide Phase-Change RF Switch Using an Independent Resistive Heater for Thermal Actuation, Proceedings 2013 IEEE Compound Semiconductor IC Symposium, pp. 1-4.

El-Hinnawy et al., A Four-Terminal, Inline, Chalcogenide Phase-Change RF Switch Using an Independent Resistive Heater for Thermal Actuation, IEEE Electron Device Letters, vol. 34, No. 10, Oct. 2013, pp. 1313-1315.

Harame et al., A High Performance Expitaxial SiGe-Base ECL BiCMOS Technology, Dec. 13-16, 1992 International Technical Digest on Electron Devices Meeting (IEDM), pp. 1-4.

Cressler et al., A Scaled 0.25-um Bipolar Technology Using Full e-Beam Lithography, IEEE Electron Device Letters, vol. 13, No. 5, May 1992, pp. 262-264.

Heinemann et al., High-Performance BiMCOS Technologies with Epitaxially-Buried Subcollectors and Deep Trenches, Institute of Physics Publishing, Semiconductor Science and Technology, vol. 22, Published Dec. 5, 2006, pp. S153-S157.

King, Development of Phase Change Materials for RF Switch Applications, Materials Science and Engineering, Raleigh, North Carolina, 2016, 200 pages.

Anonymous, The Engineer's Guide to Design & Manufacturing Advances, Aerospace & Defense Technology, Apr. 2014, 54 pages.

Birdwell et al., Exploring Materials Evolution in Phase Change RF Switches Using Raman Imaging, 2016 IEEE International Microwave Symposium (IMS2016), May 22-27, 2016 San Francisco, CA, USA, 21 pages.

Slovin et al., AlN Barriers in Phase Change RF Switches, Carnegie Mellon, Electrical & Computer Engineering, Government Microcircuit Applications and Critical Technology Conference (GOMAC), 2015, 18 pages.

Chevalier, P. et al., "Towards THz SiGe HBTs," STMicroelectronics, Crolles, France, IEEE, 2011, pp. 1-9 (9 pages.).

Ehwald, K.E. et al., "Modular Integration of High-Performance SiGe:C HBTs in a Deep Submicron, Epi-Free CMOS Process," Institute for Semiconductor Physics (IHP), Frankfurt, Germany, 1999, pp. 22.3.1-22.3.4 (4 pages.).

(56) References Cited

OTHER PUBLICATIONS

Winkler, Wolfgang et al., "60GHz and 76 GHz Oscillators in 0.25µm SiGe:C BiCMOS," IHP, Frankfurt, Germany, IEEE International Solid-State Circuits Conference, Feb. 12, 2003, pp. 1-10 (10 pages.).
Knoll, Dieter, "Industry Examples at the State-of-the-Art: IHP," Taylor & Francis Group, LLC, 2007, pp. 1-22 (22 pages.).
Borodulin, Pavel et al., "Low-Loss, Non-volatile, Phase-Change RF Switching Technology for System Reconfigurability and Reliability," Northrup Grumman, Baltimore, MD, Jan. 8, 2009, pp. 1-6 (6 pages.).
Lee, Mike et al., "Aeorospace & Defense Technology," Northrop Grumman Electronic Systems, Apr. 2014, pp. 1-6 and 30-32 (9 pages.).

\* cited by examiner

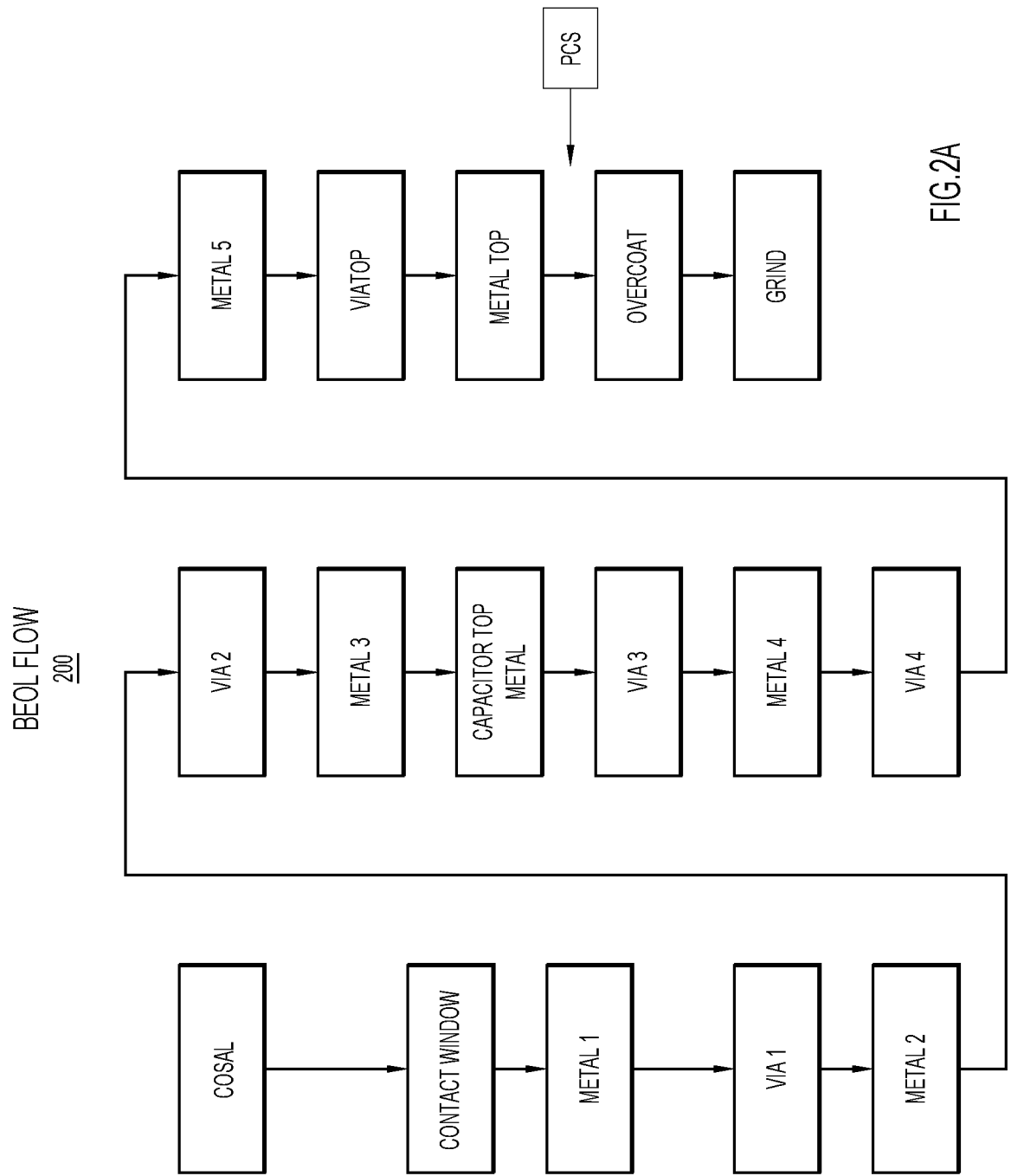

A METHOD OF INTEGRATING A PCS INTO A BiCMOS PROCESS

700

702 — PROVIDE A BASE STRUCTURE INCLUDING BiCMOS CIRCUITRY ON A SEMICONDUCTOR SUBSTRATE

704 — FORM ON THE BASE STRUCTURE A DIELECTRIC CONTACT WINDOW LAYER HAVING METAL THROUGH-PLUGS THAT CONTACT THE BiCMOS CIRCUITRY

706 — CONSTRUCT THE PCS ON THE CONTACT WINDOW LAYER OVER A PCS REGION OF THE SEMICONDUCTOR SUBSTRATE THAT IS ADJACENT TO THE BiCMOS CIRCUITRY. THE PCS INCLUDES: A PHASE CHANGE REGION, CONNECTED BETWEEN SPACED-APART OHMIC CONTACTS FORMED ON THE PHASE CHANGE REGION, CONFIGURED TO OPERATE AS AN IN-LINE SWITCH CONNECTED BETWEEN THE OHMIC CONTACTS AND THAT IS CONTROLLED BY HEAT APPLIED TO THE PHASE CHANGE REGION; AND A RESISTIVE HEATER TO GENERATE THE HEAT RESPONSIVE TO A CONTROL SIGNAL APPLIED TO THE RESISTIVE HEATER

708 — FORM, ON THE CONTACT WINDOW LAYER AND THE PCS, A STACK OF ALTERNATING PATTERNED METAL LAYERS AND DIELECTRIC LAYERS HAVING METAL THROUGH-PLUGS TO INTERCONNECT THE PATTERNED METAL LAYERS, SUCH THAT THE STACK CONNECTS A FIRST OF THE OHMIC CONTACTS TO THE BiCMOS CIRCUITRY AND PROVIDES RESPECTIVE CONNECTIONS TO A SECOND OF THE OHMIC CONTACTS AND TO THE RESISTIVE HEATER

FIG.7

METHOD TO INTEGRATE DC AND RF PHASE CHANGE SWITCHES INTO HIGH-SPEED SiGe BiCMOS

CROSS-REFERENCE TO RELATED APPLICATION

This application is a divisional of U.S. patent application Ser. No. 16/544,212, filed Aug. 19, 2019, which is incorporated herein in its entirety by reference.

TECHNICAL FIELD

The present disclosure relates generally to BiCMOS fabrication processes that incorporate fabrication of a phase change switch (PCS) and integrated circuits formed using such processes.

BACKGROUND

Silicon-Germanium (SiGe) heterojunction bipolar transistors (HBTs) and bipolar (Bi)/complementary metal oxide semiconductor (CMOS) (BiCMOS) circuits and systems are promising, readily available, technologies for ultra-high frequency applications in the radio frequency (RF) and terahertz range. SiGe BiCMOS devices and circuits that integrate the devices have been demonstrated for maximum operating frequency ranges as low as 5 GHz and as high as 700 GHz, but can operate also at lower frequencies, and are capable of integrating multiple speed and power devices in single integrated circuits (ICs). The frequency and power ranges are tuned for a particular application by altering the device geometry (e.g., smaller devices being for higher frequency applications) and the base epitaxy thickness (e.g., thinner epitaxy being for higher frequency applications). Furthermore, implementation of SiGe HBTs represents a significant enhancement over the use of III-V microelectronics in that the system-on-a-chip (SoC) concept can be leveraged, creating multi-functional electronics with reduced size, weight, and packaging, at a reduced cost.

While SiGe HBTs in BiCMOS circuits have displayed increasing RF performance and become ubiquitous replacements for expensive III-V microelectronics, conventional switching technology configured to switch into and between those transistors in a convenient, fast, and non-invasive manner has not evolved commensurately. As a result, the conventional switching technology either severely limits, or cannot support, high-speed switch-based applications for BiCMOS circuits, such as circuit programmability/re-programmability, on-chip repair, and the like.

SUMMARY OF THE INVENTION

A method of integrating a phase change switch (PCS) into a Bipolar (Bi)/Complementary Metal Oxide Semiconductor (CMOS) (BiCMOS) process is provided. The method comprises providing a base structure including BiCMOS circuitry on a semiconductor substrate, and forming on the base structure a dielectric contact window layer having metal through-plugs that contact the BiCMOS circuitry. The method further comprises constructing the PCS on the contact window layer over a PCS region of the semiconductor substrate that is adjacent to the BiCMOS circuitry. The PCS includes: a phase change region, connected between spaced-apart ohmic contacts formed on the phase change region, configured to operate as an in-line switch connected between the ohmic contacts and that is controlled by heat applied to the phase change region; and a resistive heater to generate the heat responsive to a control signal applied to the resistive heater. The method further includes forming, on the contact window layer and the PCS, a stack of alternating patterned metal layers and dielectric layers having metal through-plugs to interconnect the patterned metal layers, such that the stack connects a first of the ohmic contacts to the BiCMOS circuitry and provides respective connections to a second of the ohmic contacts and to the resistive heater.

Example embodiments of the invention are described below with reference to the following drawing figures, in which like reference numerals in the various figures are utilized to designate like components.

BRIEF DESCRIPTION OF THE DRAWINGS

FIG. 2A is an example back-end-of-line (BEOL) flow (referred to simply as a "flow") used to fabricate a BiCMOS IC and that integrates a PCS forming operation at an end of the flow.

FIG. 7 is a flowchart of an example method of integrating a PCS into a BiCMOS process.

DESCRIPTION OF EXAMPLE EMBODIMENTS

Embodiments presented herein are directed to methods of fabricating ultra-high speed SiGe BiCMOS electronics that integrate a phase-change switch (PCS), which serves as a direct current (DC) and/or RF on-chip in-line switch. The embodiments provide significant improvements over conventional methods that integrate switches at highest levels of a metal stack in an integrated circuit, because the embodiments integrate the switch prior to metallization, creating savings in RF power, and enhancing high-frequency operation. Furthermore, the integrated PCS formed by the embodiments may also be used to control or reroute CMOS electronics within the BiCMOS technology for mixed-signal and digital applications. Advantageously, the embodiments may be used to create a SiGe-HBT field-programmable gate array (FPGA) with integrated PCSs so that the FPGA is agile and reprogrammable in circuit frequency and/or functionality. Furthermore, if transistors of the FPGA do not yield in the fabrication phase, or if they fail in the field, The PCSs may be used to implement field self-healing.

Figure 1A:
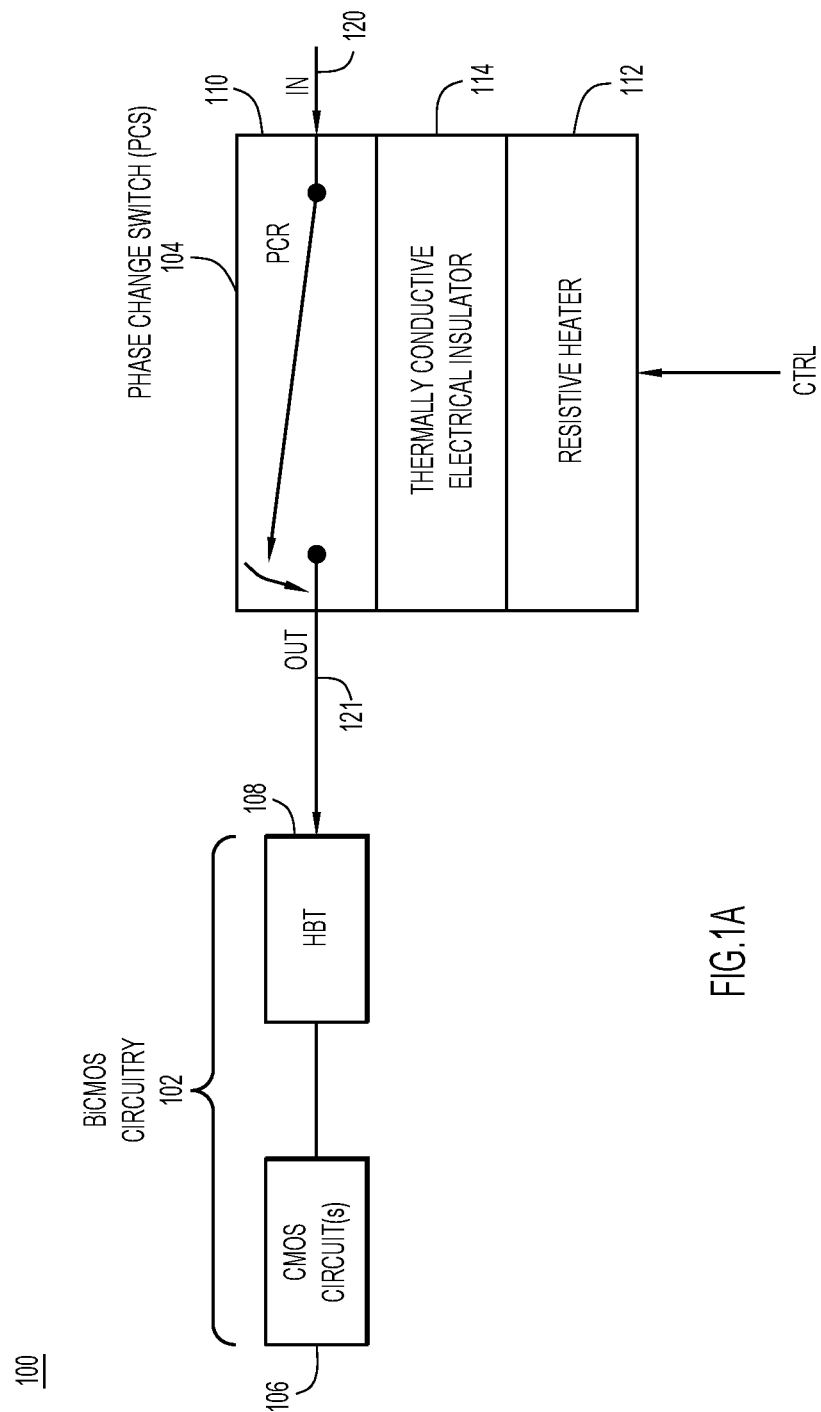
FIG. 1A is a high-level block diagram of example BiCMOS circuitry integrated with an example PCS.

With reference to FIG. 1A, there is a high-level block diagram of an example integrated circuit (IC) 100 that may be fabricated using a back-end-of-line (BEOL) flow presented herein. The BEOL flow is a second portion of an IC fabrication in which individual devices (e.g., transistors, capacitors, resistors, and the like) are interconnected with patterned metal layers of the IC. IC 100 includes BiCMOS circuitry 102 and a PCS 104 connected to the BiCMOS circuitry. IC 100 represents a non-limiting example application in which PCS 104 operates as a switch controllable between "on" or "off" states to pass or block a signal, respectively. BiCMOS circuitry 102 include CMOS circuits 106 coupled to an HBT 108. PCS 104 includes a PCS phase change region (PCR) 110 (also referred to as a "channel") proximate a resistive heater 112 (also referred to as a "resistive heater element") and separated from the resistive heater by a thermally conductive electrical insulator 114 (i.e., a barrier). PCS 104 may be controlled to be in an "on" or "off" state to pass or block a signal, as described below. PCR 110 is disposed in-line with an input 120 and an output 121 of a conductive trace or line. Input 120 receives an input signal IN, and PCR 110 may (i) provide input signal IN as an output signal OUT in a conducting state, such that the PCR acts substantially as a short-circuit or closed switch, or may (ii) block the input signal IN from being provided as the output signal OUT in a blocking state, such that the PCR 110 acts substantially as an open-circuit or open switch. As an example, the input signal IN may be a direct current (DC) signal or a high frequency radio frequency (RF) signal.

Resistive heater 112 receives a control signal CTRL to switch PCR 110 between the conducting state (e.g., closed switch) and the blocking state (e.g., open switch). Resistive heater 112 may include, for example, a metal or metal alloy material that exhibits resistivity and a substantially high thermal conductivity. The control signal CTRL may include a current pulse in one of two states to generate a heat profile from the resistive heater 112 via ohmic (i.e., $I^2R$) heat. Thus, based on the proximal arrangement of resistive heater 112 with respect to PCR 110, the heat profile can be thermally transferred to PCR 110 to control the state of PCS 104.

As an example, control signal CTRL may have pulse characteristics (e.g., amplitude and duration) that dictate the heat profile. For example, control signal CTRL may be provided in a first state (e.g., with first pulse characteristics) that generates a first heat profile from resistive heater 112, and may be provided in a second state (e.g., with second pulse characteristics) that generates a second heat profile from the resistive heater. The first heat profile may correspond to setting PCR 110 (and thus PCS 104) to the conducting state, and the second heat profile may correspond to setting the PCR (and thus the PCS) to the blocking state. PCR 110 changes state from electrically conductive to electrically insulating responsive to corresponding ones of the heat profiles.

As mentioned above, FIG. 1A is an example application or use of a PCS. The signal IN that is selectively blocked or passed by the PCS may be a power voltage, or an operational signal, such as an input RF signal, for example. In another arrangement, the PCS may selectively direct signal IN either to BiCMOS circuitry 102 or to other circuitry, not shown in FIG. 1A. In yet another example, the PCS may operate essentially to selectively activate and deactivate different circuitry, and so on.

Figure 1B:
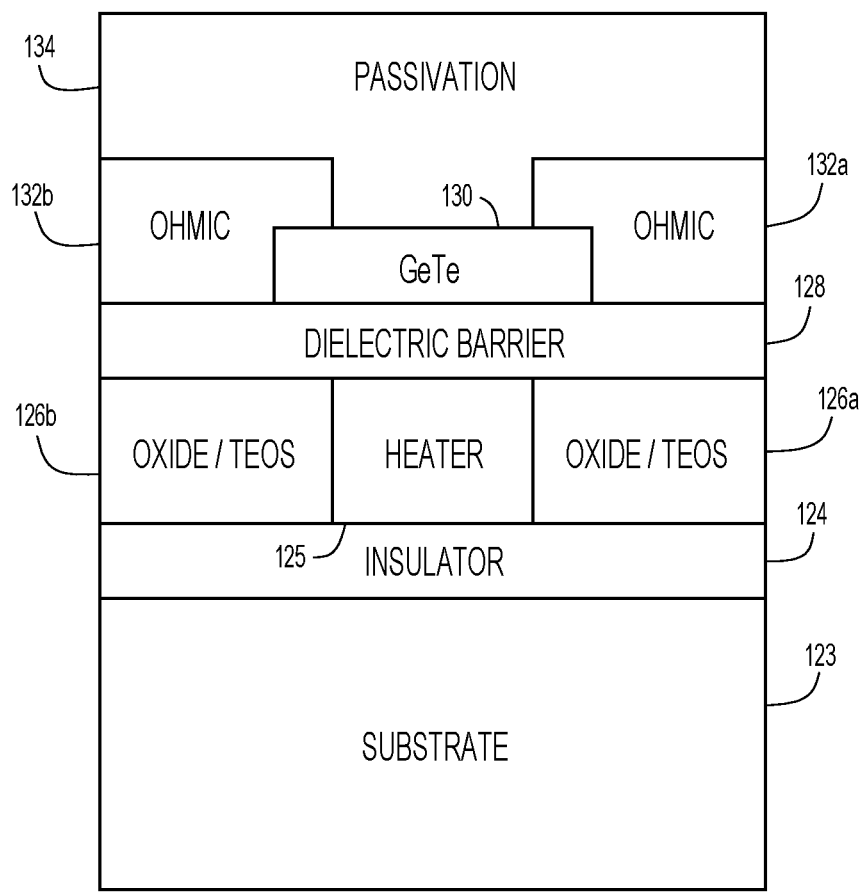
FIG. 1B is a cross-sectional view of layers of the example PCS.

With reference to FIG. 1B, there is a cross-sectional view of layers of an example PCS 122, such as PCS 104. In FIG. 1B, PCS 122 is shown as a stand-alone device; however, PCS 122 may be integrated into a structure of an integrated circuit (IC) during a BEOL flow, as described below. PCS 122 is fabricated on a semiconductor substrate 123, such as a silicon substrate. PCS 122 includes an electrically insulating layer, i.e., an insulator layer, 124 formed on substrate 123. Insulator layer 124 may be made of a dielectric, and may have a thickness (in the vertical direction) of approximately 100-600 Å. PCS 122 includes a resistive heater 125 (e.g., resistive heater 112 of PCS 104) formed on insulator layer 124. Resistive heater 125 may be made of a metal composition, such as Tungsten, and have a thickness of approximately 2500-4000 Å, for example. Resistive heater 125 has a width (in the horizontal direction) that is less than a width of insulator layer 124, and the heater is centered on the insulator layer, leaving exposed portions of the insulating layer adjacent to opposing sides of the heater.

PCS 122 includes dielectric layers 126a and 126b formed on the exposed portions of insulator layer 124 and flush against the opposing sides of resistive heater 125. Dielectric layers 126a and 126b may be made of an oxide, such as Tetraethyl Orthosilicate (TEOS), and have respective thicknesses equal to the thickness of resistive heater 125. PCS 122 includes a dielectric barrier layer 128 (e.g., insulator 114 of PCS 104) formed on resistive heater 125 and dielectric layers 126a and 126b. Dielectric barrier layer 128 may have a thickness of approximately 600 Å, for example.

PCS 122 includes a PCR 130 (e.g., PCR 110 of PCS 104) formed on dielectric barrier layer 128. Dielectric barrier layer 128 electrically insulates PCR 110 from resistive heater 112, but conducts heat from the heater to the PCR. PCR 130 may be made of a chalcogenide material, such as Germanium Telluride (GeTe), Germanium Antimony Telluride (GeSbTe), Germanium Selenium Telluride (GeSeTe), or any of a variety of similar materials. PCR 130 may have a thickness of approximately 1200 Å, for example. PCR 130 has as a width that is less than a width of dielectric barrier layer 128, and is centered on the dielectric barrier layer, leaving exposed portions of the dielectric barrier layer adjacent to opposing sides of the PCR. Spaced-apart ohmic contacts 132a and 132b are formed on opposing or spaced-apart sides of PCR 130 and on the exposed portions of dielectric barrier layer 128 adjacent the sides of the PCR. Ohmic contacts 132a, 132b may be made of a Titanium-Nickel composition, and have a thickness of at least 2500 Å, for example. A horizontal gap separates spaced-apart ohmic contacts 132a and 132b. PCS 122 includes a passivation layer 134 formed on ohmic contacts 132a and 132b and PCR 130, and fills the gap between the ohmic contacts. Passivation layer 134 may be made be made of SiNx, and have a thickness of at least 1600 Å, for example.

With reference to FIG. 2A, there is an example BEOL 200 flow (referred to simply as a "flow") used to fabricate a BiCMOS integrated circuit (IC). Flow 200 includes a sequence of layer forming operations (e.g., COSAL, Contact window (CW), Metal (M) 1 (M1), VIA1, M2, VIA2, . . . , MTOP, and so on) that construct a sequence of layers of the IC one on top of the other. Flow 200 represents a repeating 6 layer metal/via flow. A PCS forming operation (labeled "PCS" in FIG. 2A) may be integrated into flow 200 at or near an end of the flow.

Figure 2B:
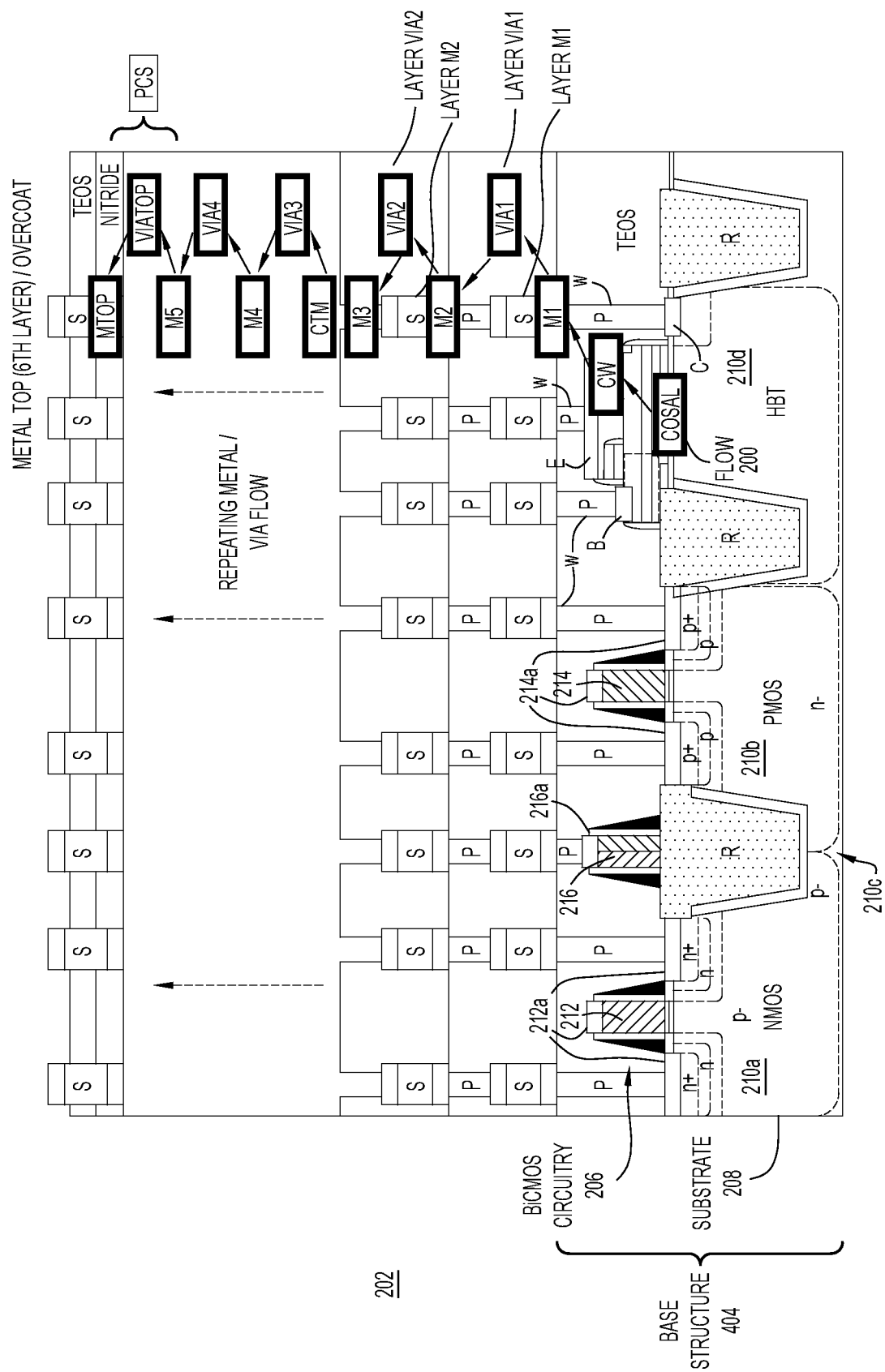
FIG. 2B is an illustration of the example flow from FIG. 2A superimposed on a cross-sectional view of an example BiCMOS IC constructed by the flow.

With reference to FIG. 2B, there is an illustration of flow 200 used to fabricate an example BiCMOS IC 202, superimposed on a cross-sectional view of the BiCMOS IC. BiCMOS IC 202 is shown as a vertical stack of layers formed one on top of the other. Flow 200 includes a sequence of layer forming operations (e.g., COSAL, CW, M1, VIA1, M2, VIA2, . . . , MTOP) that form respective layers of the vertical stack, in sequence, on top of a base structure 204 of IC 202. On the right-hand-side of FIG. 2B, identifiers COSAL, CW, M1, VIA1, M2, VIA2, . . . , MTOP identify both (i) respective operations to form layers (i.e., layer forming operations), and (ii) the respective layers that are formed by the operations. Thus, the identifiers are shown as a vertical progression of operations superimposed on the respective layers formed by the operations. The operations progress in time from the bottom of FIG. 2B to the top of FIG. 2B.

Operations M1, M2, M3, . . . MTOP of flow 200 represent patterned metal layer forming operations because they form patterned metal layers of the vertical stack, i.e., they form patterned metal layers M1, M2, M3, . . . MTOP, respectively. Alternatively, operations CW, VIA1, VIA2, . . . , VIATOP of flow 200 represent planarized dielectric layer forming operations because they form respective planarized dielectric layers (layers VIA1, VIA2, . . . , VIATOP, respectively) of the vertical stack that alternate with the patterned metal layers. As will be described below, the planarized dielectric layers include spaced-apart metal through-plugs (hereinafter referred to more simply as "metal plugs") to electrically interconnect the patterned metal layers, and to connect the patterned metal layers to the BiCMOS circuitry of IC 202.

Before flow 200 is started, base structure 204 is provided. Flow 200 forms the above-mentioned vertical stack of layers on base structure 204. Base structure 204 includes BiCMOS circuitry 206 constructed on a semiconductor substrate 208. Semiconductor substrate 208 may be a silicon substrate that includes: an n-doped region 210a (i.e., NMOS region 210a) that serves as a site for an NMOS device 212 constructed on the n-doped region; a p-doped region 210b (i.e., PMOS region 210b) adjacent to the n-doped region and that serves as a site for a PMOS device 214 constructed on the p-doped region; an n-p region 210c, formed at a junction between the n-doped region and the p-doped region, that serves as an n-p site for an n-p device 216 constructed on the n-p site; and a region 210d, adjacent to the p-doped region, that serves as an HBT site for an HBT 218 constructed on the HBT site. NMOS device 212, PMOS device 214, and n-p device 216 collectively form MOS devices. The MOS devices and HBT 218 collectively form BiCMOS circuitry 206. Semiconductor substrate 208 may also include radiation zones or wells R spaced-apart across the semiconductor substrate to separate regions 210a, 210b, and 210d, for example.

In an example, NMOS device 212 may comprise an NMOS polysilicon device having polysilicide electrical contacts 212a formed on top surfaces of the device. PMOS device 214 may comprise a PMOS polysilicone device having polysilicide electrical contacts 214a formed on a top side of the device. N-P device 216 may have an electrical contact 216a formed on a top surface of the device. HBT 218 includes electrical contacts formed on a topside of the HBT for a base (B), an emitter (E), a collector (C), and a power terminal (not shown in FIG. 2B) of the HBT.

Flow 200 starts with operation COSAL, shown at the bottom of FIG. 2B, and progresses to MTOP and OVER-COAT at the top of FIG. 2B.

Operation COSAL forms a low resistance contact layer (not shown in FIG. 2B) on base structure 204.

Next, operation contact window (CW) is performed. Operation CW is the first planarized dielectric forming operation of flow 200. More specifically, at operation CW, a planarized contact window layer CW is formed on a top surface of base structure 204, over BiCMOS circuitry 206 and any exposed regions of semiconductor substrate 208. Contact layer CW includes spaced-apart contact windows W or through-holes (i.e., vias, not all of which are labeled in FIG. 2B) extending from a top surface of the contact window layer CW down through the contact window layer to the top surface of base structure 204. Contact windows W are filled with respective ones of spaced-apart metal plugs P, i.e., the metal plugs are embedded in the contact windows. Metal plugs P contact various ones of the electrical contacts of CMOS devices 212-216, and various ones of electrical contacts B, E, and C of HBT 218, as shown in FIG. 2B.

To form planarized contact window layer CW, a blanket layer of TEOS approximately 1300 thick, for example, is deposited on the top surface of base structure 204. The layer of TEOS is planarized by chemical mechanical polishing (CMP), for example, and then cleaned. Following the polishing and cleaning, photoresist is deposited on the TEOS layer, the photoresist is patterned with photolithography, and then dry etched to form windows W, spaced-apart across the layer of TEOS, down through the layer of TEOS to underlying base structure 204. The photoresist is stripped and the resulting layer cleaned. Metal plugs P are deposited into contact windows W. Metal plugs P may be made of Tungsten, for example. The resulting layer with spaced-apart plugs W embedded therein is polished to planarize tops of plugs P to the top of the layer.

Next, patterned metal forming operation M1 is performed. Operation M1 is the first patterned metal forming operation of flow 200. More specifically, at operation M1, a patterned metal layer M1 is formed on contact window layer CW. To form patterned metal layer M1, a metal slab film is deposited on contact window layer. Photoresist is deposited on the metal slab film, patterned with photolithography, and dry etched. The layer is then stripped of photoresist and cleaned. The resulting patterned metal layer M1 includes spaced-apart metal slabs S, spread across the layer, in contact with respective ones of underlying spaced-apart plugs P (i.e., the plugs in underlying contact window layer CW), and also includes conductive traces (not shown in the cross-sectional view of FIG. 2B) connecting various ones of the plugs P. Metal slabs S may be made of an Aluminum-Copper composition, for example.

Next, planarized dielectric layer forming operation VIA1 is performed. Operation VIA1 is the second planarized dielectric layer forming operation of flow 200. More specifically, at operation VIA1, a planarized dielectric layer VIA1 is formed on patterned metal layer M1. Dielectric layer VIA1 includes spaced-apart vias filled with respective ones of layer-specific metal plugs P that contact respective ones of underlying spaced-apart slabs S of underlying patterned metal layer M1. Dielectric layer VIA1 with metal plugs P embedded therein is formed on patterned metal layer M1 in substantially the same way that contact widow layer CW is formed on base structure 204 in operation CW, except that in operation VIA1, patterned metal layer M1 represents the starting or "base structure" on which the dielectric layer VIA1 is formed. For example, to form dielectric layer VIA1, a TEOS layer, or alternatively, a layer of fluorinated silicate glass, is deposited on patterned metal layer M1 and exposed areas of contact window layer CW. Photoresist is deposited on the layer, patterned with photolithography, dry etched, and so on, as described above, to form the spaced-apart vias through the layer. Then, layer-specific metal plugs P are deposited into the vias so as to contact underlying spaced-apart metal slabs S of patterned metal layer M1.

At second patterned metal layer forming operation M2, a patterned metal layer M2 is formed on dielectric layer VIA1 in substantially the same that way patterned metal layer M1 is formed on contact window layer CW.

The above-described sequence of planarized dielectric layer forming and patterned metal layer forming operations (VIA1, M2) is repeated multiple times at next operations (VIA3, M4), (VIA4, M5), and (VIATOP, MTOP), in what is referred to in FIG. 2B as a "Repeating Metal/Via flow," to produce corresponding alternating planarized dielectric and patterned metal layers that complete the vertical stack of layers of IC 202. An operation OVERCOAT forms a dielectric overcoat layer OVERCOAT on top-most patterned metal layer MTOP. Dielectric overcoat layer OVERCOAT may be made of TEOS, for example. The vertical stack of layers of IC 202 includes patterned metal layers and planarized dielectric layers with spaced-apart embedded metal plugs therein alternating with the patterned metal layers, such that the spaced-apart metal plugs interconnect the patterned metal layers, and also connect the various electrodes of BiCMOS circuitry 206 to the patterned metal layers.

Near the end of flow 200, the flow initiates operation PCS to form a PCS (not shown in FIG. 2B) on IC 202. As a result, the PCS is positioned relatively far away from BiCMOS circuitry 206, i.e., is spaced from the BiCMOS circuitry by a full height—or nearly a full height—of the vertical stack of layers of IC 202. The PCS at the top of the vertical stack is electrically connected to BiCMOS circuitry 206 at the bottom of the vertical stack through the intervening patterned metal layers and the dielectric layers between the PCS and the BiCMOS circuitry. Thus, a signal flowing between the PCS and BiCMOS circuitry 206 traverses a signal path through all of the intervening layers, which collectively couple significantly high levels of parasitic parameters, including electrical resistance, inductance, and capacitance, to the signal path. Disadvantageously, the high levels of parasitic parameters significantly limit (and thus lower) the upper frequency of the signal that can traverse the path, and also significantly attenuate the signal as the signal traverses the path.

Figure 3:
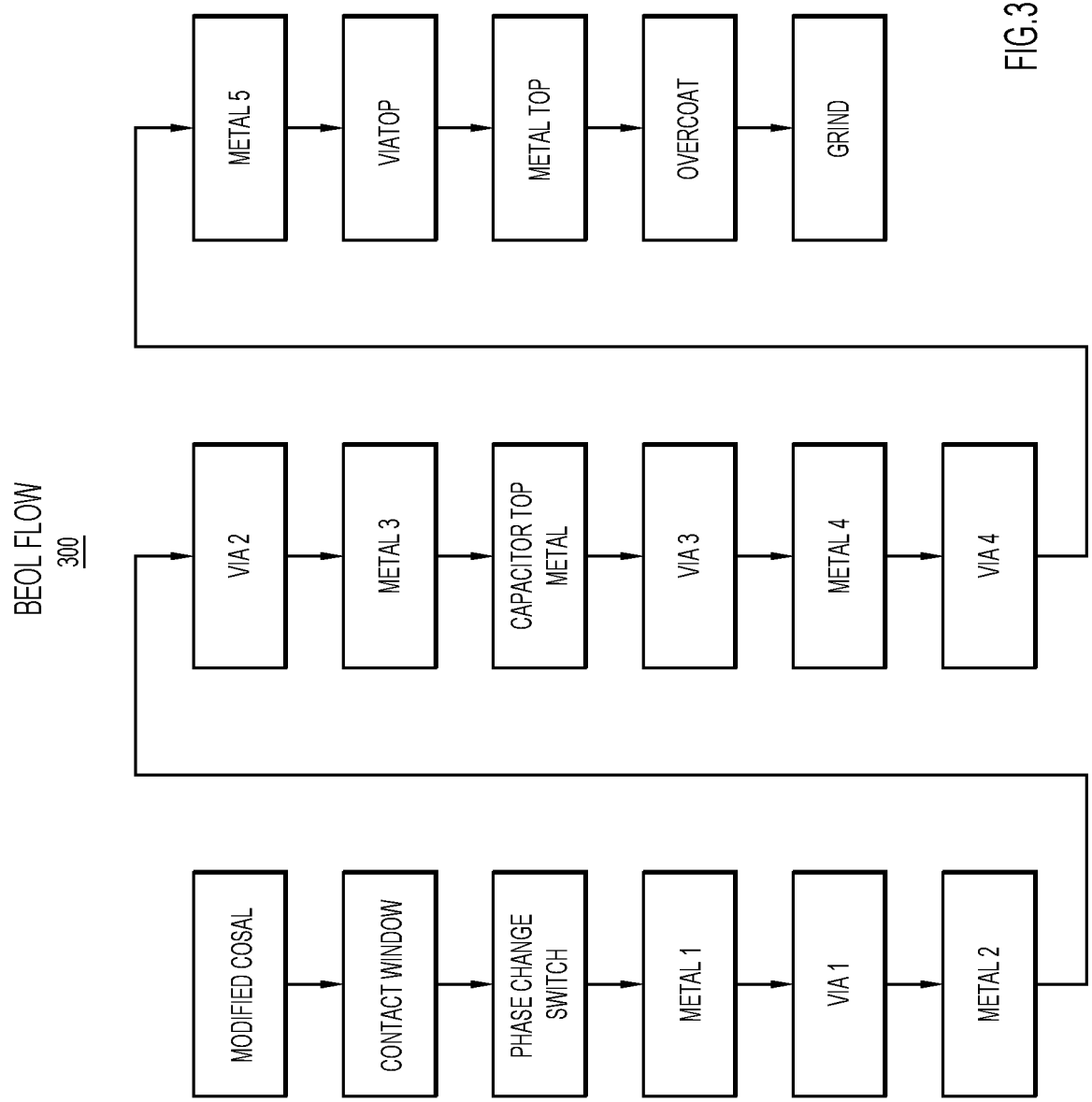
FIG. 3 is an example BEOL flow (referred to simply as a "new flow") that introduces a PCS forming operation near a beginning of the new flow.

Accordingly, embodiments presented below are directed to a new BEOL flow that obviates the above-described problems and offers advantages described below. With reference to FIG. 3, there is shown an example new BEOL flow 300 (referred to simply as a "flow") that introduces operation PCS (i.e., the operation that forms the PCS) near the beginning of the flow, not at the end of the flow, as is done in flow 200. As a result, the flow 300 constructs the PCS relatively nearer to BiCMOS circuitry 206 than does flow 200, and eliminates the intervening dielectric and patterned metal layers that result from flow 200. The arrangement significantly reduces the above-mentioned parasitic parameters, which increases the upper frequency limit of any signals flowing between the PCS and BiCMOS circuitry 206, and decreases signal attenuation.

More specifically, as shown in FIG. 3, flow 300 integrates/introduces operation PCS as the third operation, near the start, of the flow between contact window forming operation CW and first patterned metal forming operation M1. As a result, flow 300 forms the PCS on contact window layer CW, but beneath patterned metal layer M1. In other words, the PCS is constructed (and thus positioned) between contact window layer CW and patterned metal layer M1. In other examples, operation PCS may be performed immediately after patterned metal forming operation M1 or M2, which is still advantageous over flow 200.

A method of fabricating at least a portion of an IC in accordance with flow 300 is now described in connection with FIGS. 4A-4G, which show a sequential build-up of layers of the IC, including layers of a PCS (shown best as PCS 468 in FIGS. 4F and 4G), resulting from the flow. Flow 300 forms layers/elements of a PCS primarily in early operations CW and PCS of the flow, which are broken-down into various layer forming sub-operations, described below.

Figure 4A:
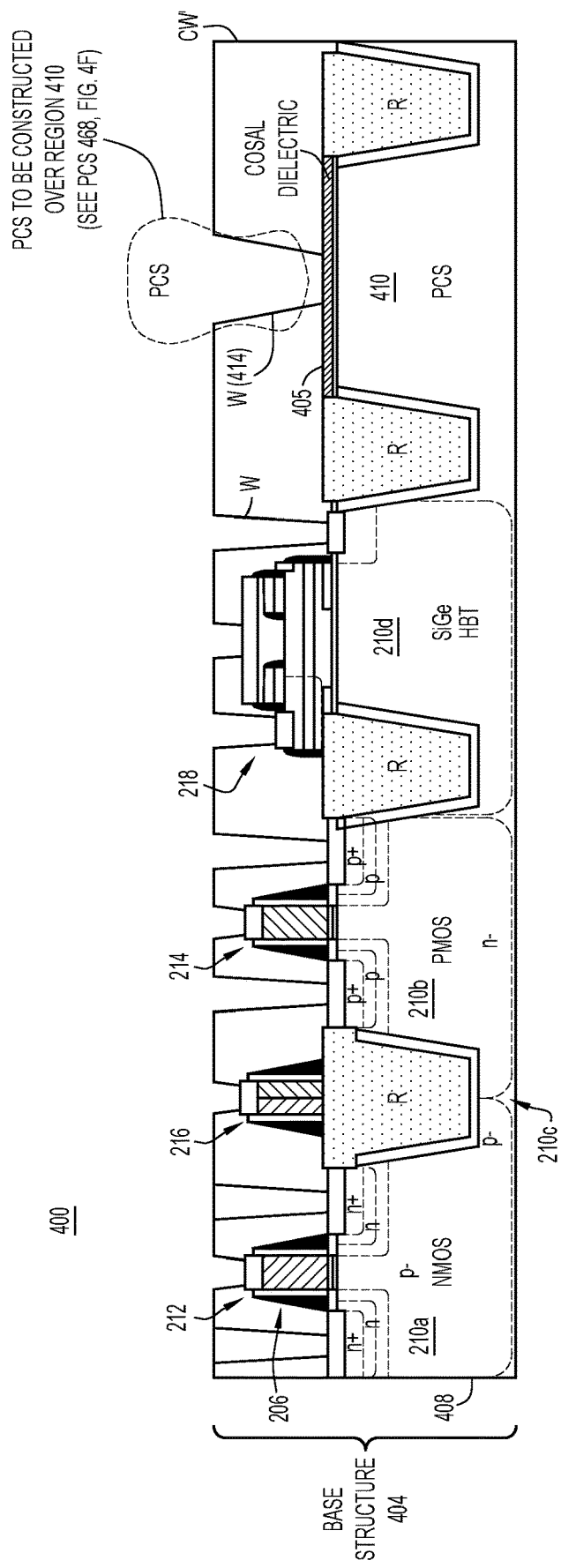
FIG. 4A is a cross-sectional view of an example structure, including a Cobalt Self-Aligning Silicide (COSAL) dielectric layer and a contact window for a heater of a PCS, formed by a modified COSAL operation and a contact window formation operation of the new flow.

With reference to FIG. 4A, there is a cross-sectional view of an example structure 400 formed by performing a modified COSAL operation and a CW formation operation of flow 300 on a base structure 404. Base structure 404 includes BiCMOS circuitry 206 (which is the same as that shown in FIG. 2B) formed on a semiconductor substrate 408. Semiconductor substrate 408 is similar to semiconductor substrate 208 of FIG. 2B, except that semiconductor substrate 408 is extended in the horizontal direction to also include an active region 410 that is adjacent to region 210d (the HBT site) and that servers as a PCS site on which a PCS is to be constructed.

The modified COSAL operation forms a low resistance contact layer (not shown in FIG. 4A) on base structure 404, and also forms a Cosal dielectric layer 405 only on active region 410 (i.e., the PCS site) of base structure 404. Cosal dielectric layer 405 may be relatively thin, e.g., approximately 300 Å thick. Then, the CW formation operation forms a contact window layer CW' on base structure 404 and Cosal dielectric layer 405. Contact window layer CW' includes the same windows W of contact window layer CW of IC 202, plus an additional contact window 414 formed through the layer down to Cosal dielectric layer 405. Additional contact window 414 forms a site for a heater of the PCS that is to be constructed on contact window CW' in subsequent operations, described below. Contact window layer CW' may be formed on base structure 400 and Cosal dielectric layer 405 in substantially the same way contact window layer CW is formed on base structure 204, as described above. All of the contact windows W of contact window layer CW', including contact window 414, may be formed at the same time in a single level of photoresist patterning and window etching. Alternatively, a separate photolithography level of photoresist patterning and widow etching may be performed specifically to form contact window 414, to account for the thickness of Cosal dielectric layer 405 beneath contact window 414.

Figure 4B:
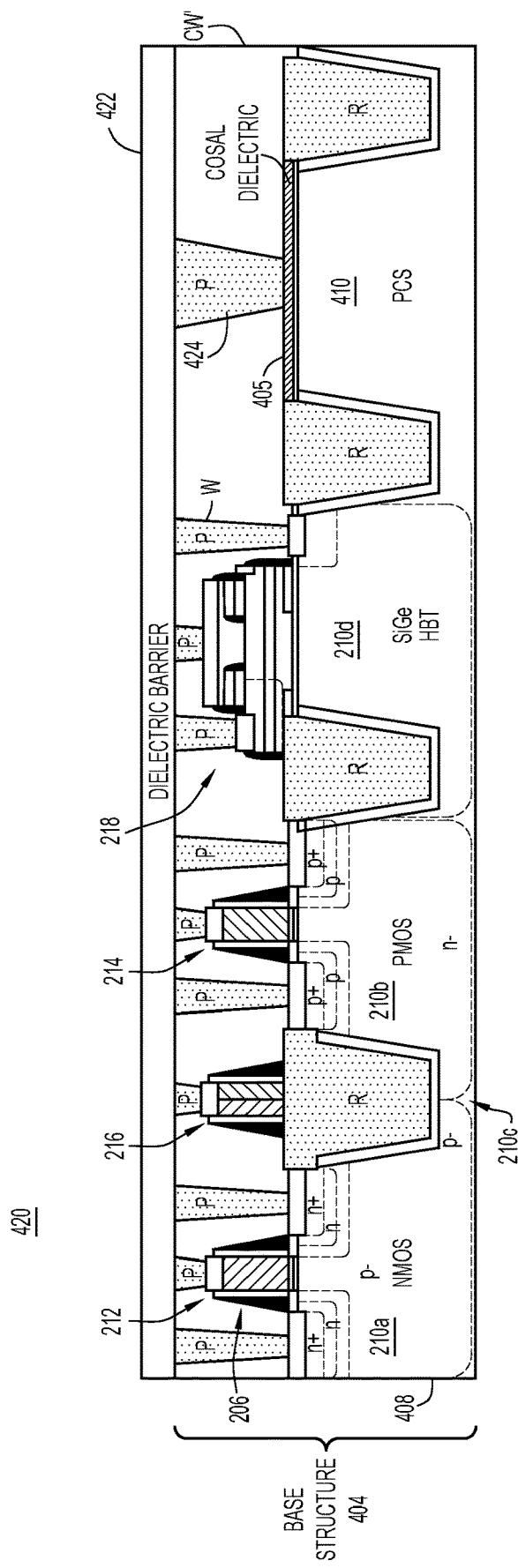
FIG. 4B is a cross-sectional view of an example structure, including the heater for the PCS, formed by performing a heater formation operation and a barrier formation operation of the new flow on the structure of FIG. 4A.

With reference to FIG. 4B, there is a cross-sectional view of an example structure 420 that results from performing a heater formation operation and a barrier formation operation on structure 400. Structure 420 includes base structure 404, Cosal dielectric layer 405 formed on the base structure, contact window layer CW' with metal plugs P deposited into contact windows W in the heater formation operation, and a dielectric barrier layer 422 formed on contact window layer CW' by the barrier formation operation. Metal plugs P include a metal plug 424 that forms a resistive heater for the PCS. Dielectric barrier layer 422 may be made of a SiNx material, and may be approximately 300 Å thick, for example.

Figure 4C:
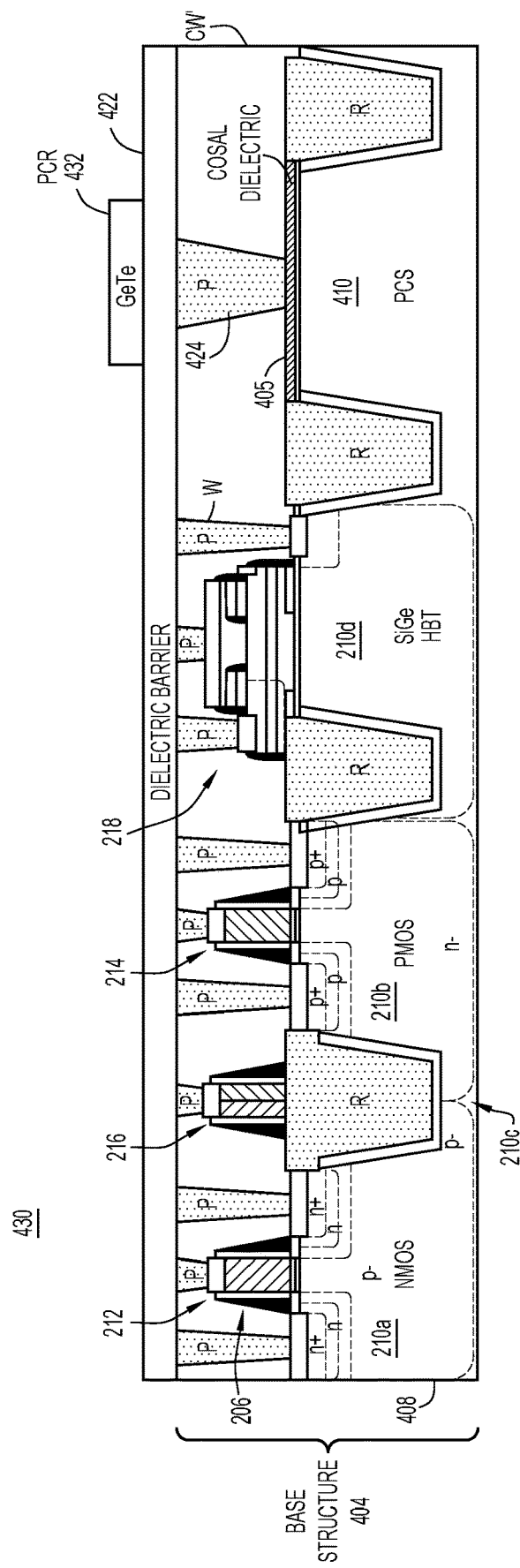
FIG. 4C is a cross-sectional view of an example structure, including a phase change region (PCR) of the PCS, formed by performing a PCS PCR operation on the structure of FIG. 4B.

With reference to FIG. 4C, there is a cross-sectional view of an example structure 430 that results from performing a PCS phase changing region (PCR) operation on structure 420. Structure 430 includes the layers of structure 420 and a PCS PCR layer 432 (referred to simply as PCR 432) formed (e.g., deposited) on dielectric barrier layer 422, over top of metal plug 424, by the PCS PCR operation. PCR 432 is vertically aligned with metal plug 424 so that the PCR overlies the metal plug. PCR 432 may be approximately 300 Å, and may be formed of GeTe, for example.

PCR 432 may be formed using different techniques. In one example, photoresist is deposited on dielectric barrier layer 422, patterned using deep ultraviolet (DUV) projection lithography. Then, a blanket layer of the material comprising PCR 432 (e.g., GeTe) is deposited on the patterned dielectric barrier layer by evaporation or physical vapor deposition (PVD), for example. Next, the blanket layer of the material comprising PCR 432 is patterned by liftoff of the photoresist, to form the PCR. In another example, the aforementioned process may be reversed. That is, the blanket layer of material comprising PCR 432 is patterned using deep ultraviolet (DUV) projection lithography, for example, and then dry etched down to dielectric barrier layer 422, for form the PCR.

Figure 4D:
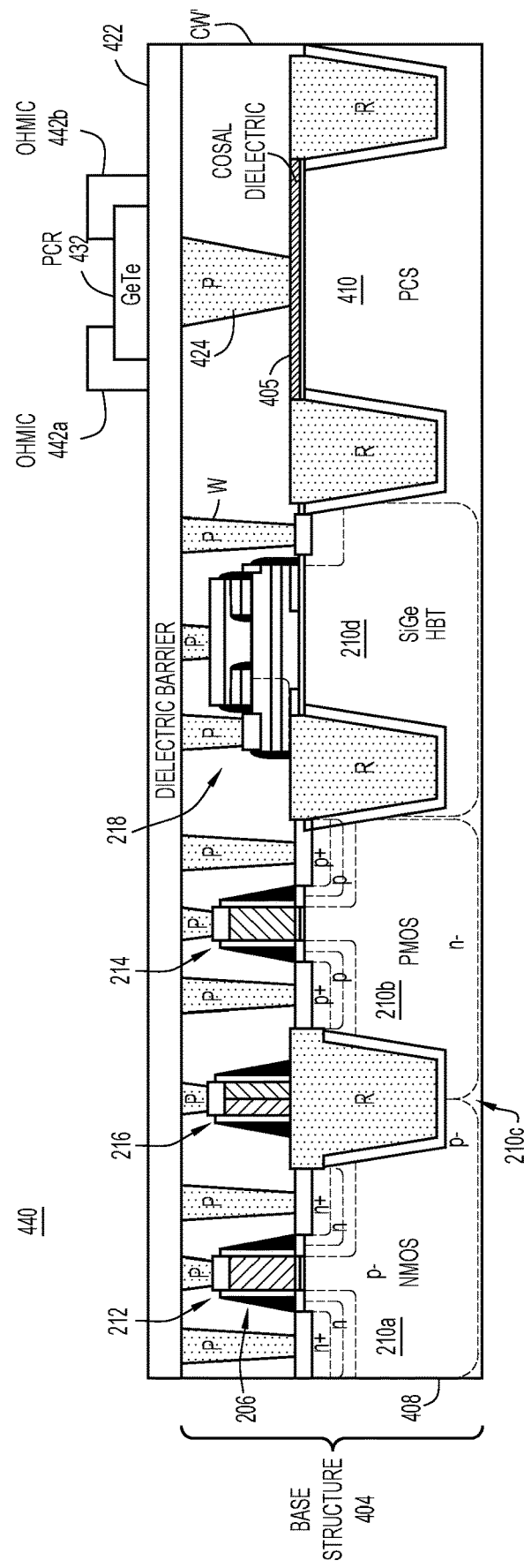
FIG. 4D is a cross-sectional view of an example structure, including ohmic contacts of the PCS, formed by performing an ohmic contact formation operation on the structure of FIG. 4C.

With reference to FIG. 4D, there is a cross-sectional view of an example structure 440 that results from performing an ohmic contact formation operation on structure 430. Structure 440 includes spaced-apart ohmic contacts 442a and 442b formed on corresponding spaced-apart opposing ends of PCR 432 and small portions of dielectric barrier layer 422 adjacent to the opposing ends. Ohmic contacts 442a, 442b (collectively, "ohmic contacts 442") are spaced-apart to leave a small, horizontal gap between the ohmic contacts. To form ohmic contacts 442a, 442b, photoresist is deposited on PCR 432 and dielectric barrier layer 422, and then the photoresist is patterned by DUV projection lithograph, for example. A metal film, e.g., 2500 Å thick Titanium-Nickel, is then deposited by evaporation or PVD and patterned by lift-off. Alternatively, the aforementioned process may be reversed, such that the metal film is patterned by dry etching.

Figure 4E:
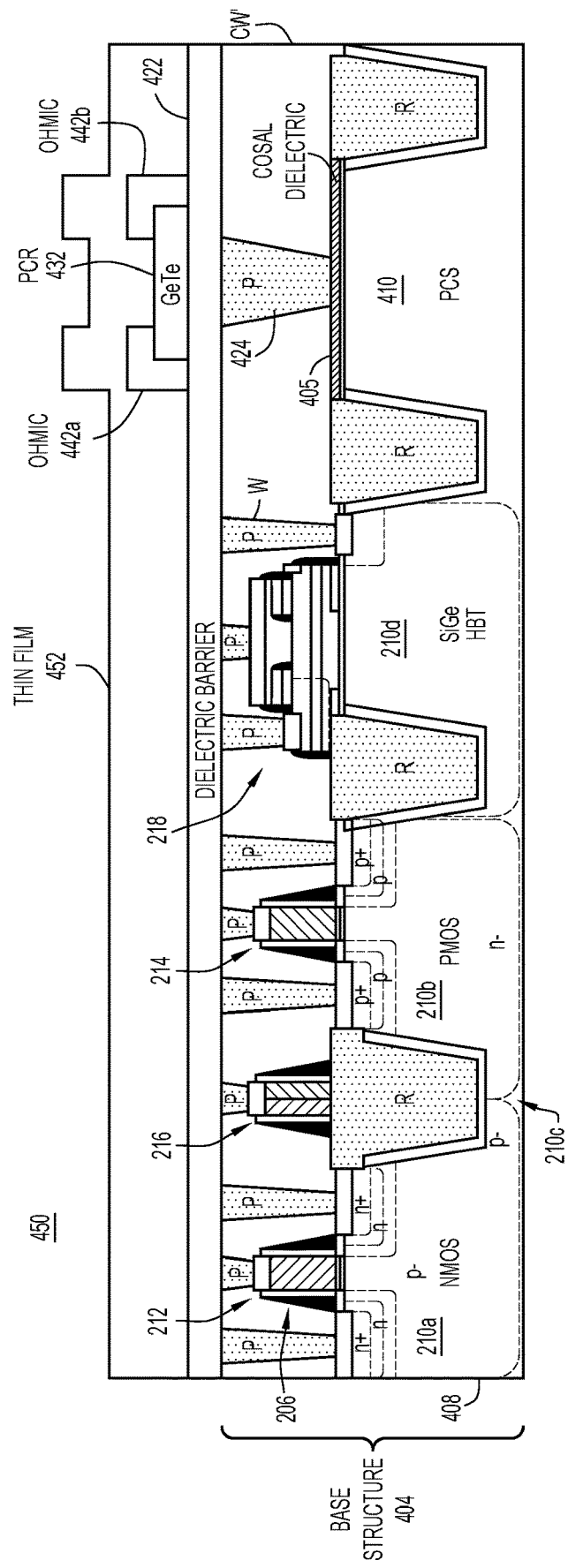
FIG. 4E is a cross-sectional view of an example structure, including part of a nitride spacer of the PCS, formed by performing a first portion of a nitride spacer formation operation on the structure of FIG. 4D.

With reference to FIG. 4E, there is a cross-sectional view of an example structure 450 that results from performing a first portion of a nitride spacer formation operation to structure 430. Structure 450 includes a thin film 452 of SiNx, for example, deposited on dielectric barrier layer 422, ohmic contacts 442a, 442b, and PCR 432 so that the thin film fills the gap between the ohmic contacts. Thin film 452 may have a thickness greater than 2500 Å, for example. Thin film 452 may be deposited using plasma-enhanced chemical vapor deposition (PECVD), for example.

Figure 4F:
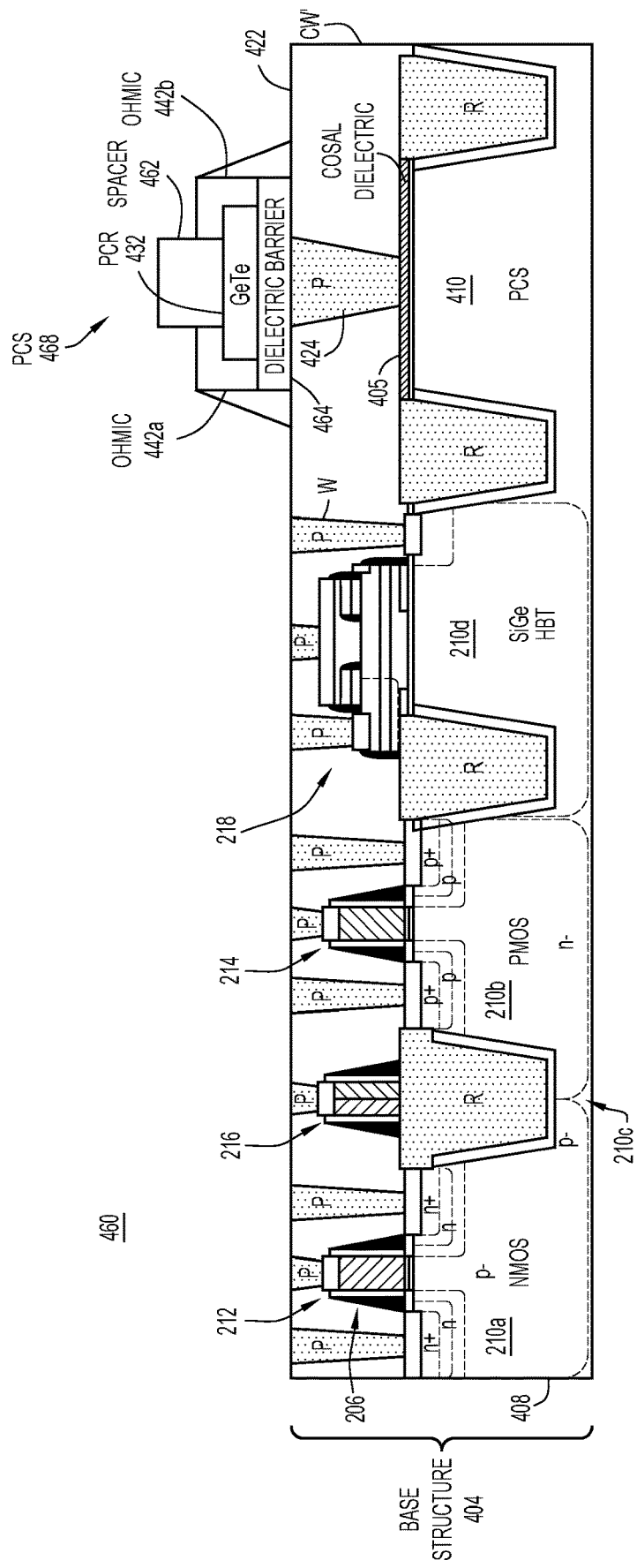
FIG. 4F is a cross-sectional view of an example structure, including the nitride spacer integrated into a completed PCS, formed by performing a second portion of the nitride spacer formation operation on the structure of FIG. 4E.

With reference to FIG. 4F, there is a cross-sectional view of an example structure 460 including a completed PCS 468 that results from performing a second portion of the nitride spacer formation operation on structure 450. Structure 460 includes a nitride spacer 462, formed from thin film 452, between ohmic contacts 442a, 442b. To form nitride spacer 462, photoresist is deposited on thin film 452. Using DUV projection lithography, the photoresist is patterned to remove the photoresist everywhere except aligned to a center of the PCS. Thin film 452 is then dry etched and the resulting structure cleaned to leave nitride spacer 462 (e.g., of SiNx) only over a top of PCS 468, while exposing ohmic contacts 442a, 442b, as shown in FIG. 4F. The process also removes most of dielectric barrier layer 422, leaving a dielectric barrier 464 between metal plug 424 and PCR 432 to electrically insulate the metal plug from the PCR.

The above-described operations construct completed PCS 468 positioned over PCS site/region 410 of base structure 404, between contact layer CW' (i.e., the first dielectric layer having windows/through-holes therein formed on base structure 404) and first patterned metal layer M1 to be formed over the contact window layer and the PCS. PCS 468 includes metal plug 424 formed in contact window layer CW' on Cosal dielectric layer 405, dielectric barrier (layer) 464 formed on the metal plug, PCR (layer) 432 formed on the dielectric barrier, spaced-apart ohmic contacts 442a, 442b formed on the PCR and spilling over onto portions of the dielectric barrier that are adjacent to sides of the ohmic contacts, and spacer 462 formed between the ohmic contacts. The position of PCS 468 avoids intervening patterned metal and dielectric layers (except for the single contact window layer CW') between the PCS and base structure 404, i.e., there are no patterned metal layers or dielectric layers between the PCS and BiCMOS circuitry 206, except for the contact window layer CW'.

After structure 460 (including PCS 468) is formed, flow 300 performs subsequent patterned metal layer and planarized dielectric layer forming operations of flow 300 (e.g., M1, VIA1, M2, VIA3, and so on) to form a stack of alternating patterned metal layers and planarized dielectric layers on top of contact window layer CW' and PCS 468. The patterned metal layers and metal plugs of the planarized dielectric layers of the stack are configured to electrically connect one or more of ohmic contacts 442a, 442b of the PCS to one or more of the various electrodes of BiCMOS circuitry 206. The stack also provides electrical connections to metal plug 424 through ohmic contacts formed on the metal plug (and not shown in FIG. 4F).

Figure 4G:
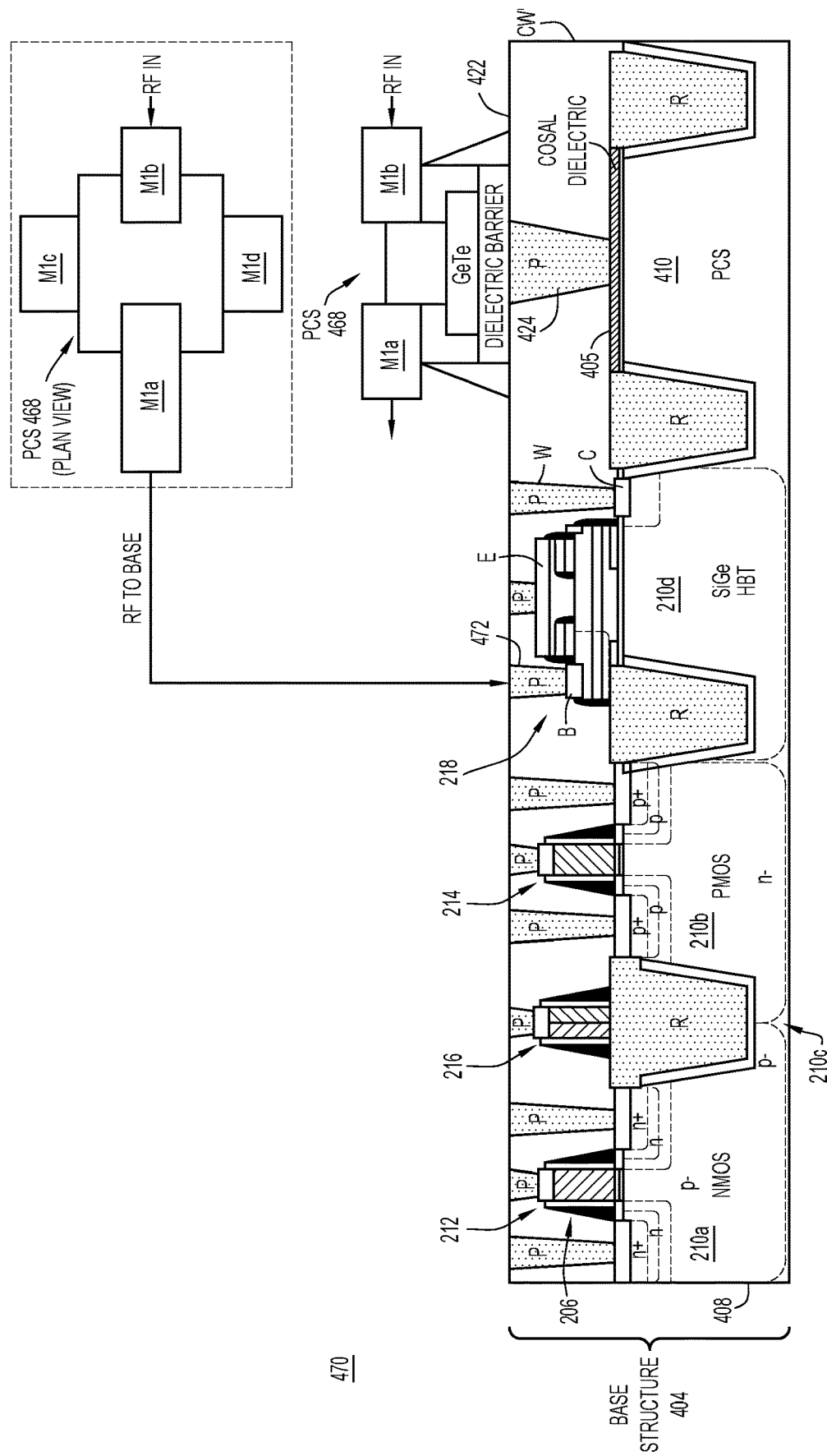
FIG. 4G is a cross-sectional view of an example structure, having electrical connections between the PCS and BiCMOS circuitry of the structure of FIG. 4F, after one or more patterned metal layers and planarized dielectric layers with metal plugs embedded therein are formed over the PCS and the BiCMOS circuitry.

With reference to FIG. 4G, there is a cross-sectional view of an example structure 470 that shows electrical connections between PCS 468 and BiCMOS circuitry 206 that result from constructing one or more patterned metal layers (not specifically shown in FIG. 4G) and planarized dielectric layers with metal plugs therein to interconnect the patterned metal layers (not specifically shown in FIG. 4G) on top of the PCS and contact window layer CW'. Also shown in FIG. 4G is a plan view (PV) of PCS 468 that reveals the above-mentioned electrical connections.

Structure 470 includes spaced-apart metal M1a and M1b (e.g., conductive metal traces and/or metal slabs S) of patterned metal layer M1 in contact with ohmic contacts 442a and 442b, respectively. Metal M1a and M1b are not in direct contact with each other. Metal M1a is electrically connected to base B of HBT 210 through patterned metal (i.e., electrically conductive) traces of metal layer M1 and a metal plug 472 of contact window layer CW'. Structure 470 also includes spaced-apart metal M1c and M1d (e.g., conductive metal traces and/or metal slabs) of patterned metal layer M1 electrically connected to spaced-apart ohmic contacts (not shown in FIG. 4G) formed on a top of metal plug 424.

In operation, for example, an RF signal is applied to metal M1b and thus to ohmic contact 442b. Also, a control signal is applied to metal M1c, M1d and thus to metal plug 424

(that represents a resistive heater)110. PCR 432 operates as an in-line switch connected between metal M1a, M1b that is controlled to open or close (i.e., to block the RF signal from metal M1a or pass the RF signal to metal M1a) responsive to heat applied to the phase change region. Metal plug 424 generates the heat responsive to the control signal applied to the metal plug. Thus, the in-line switch is controlled to open or close responsive to the control signal.

Figure 5:
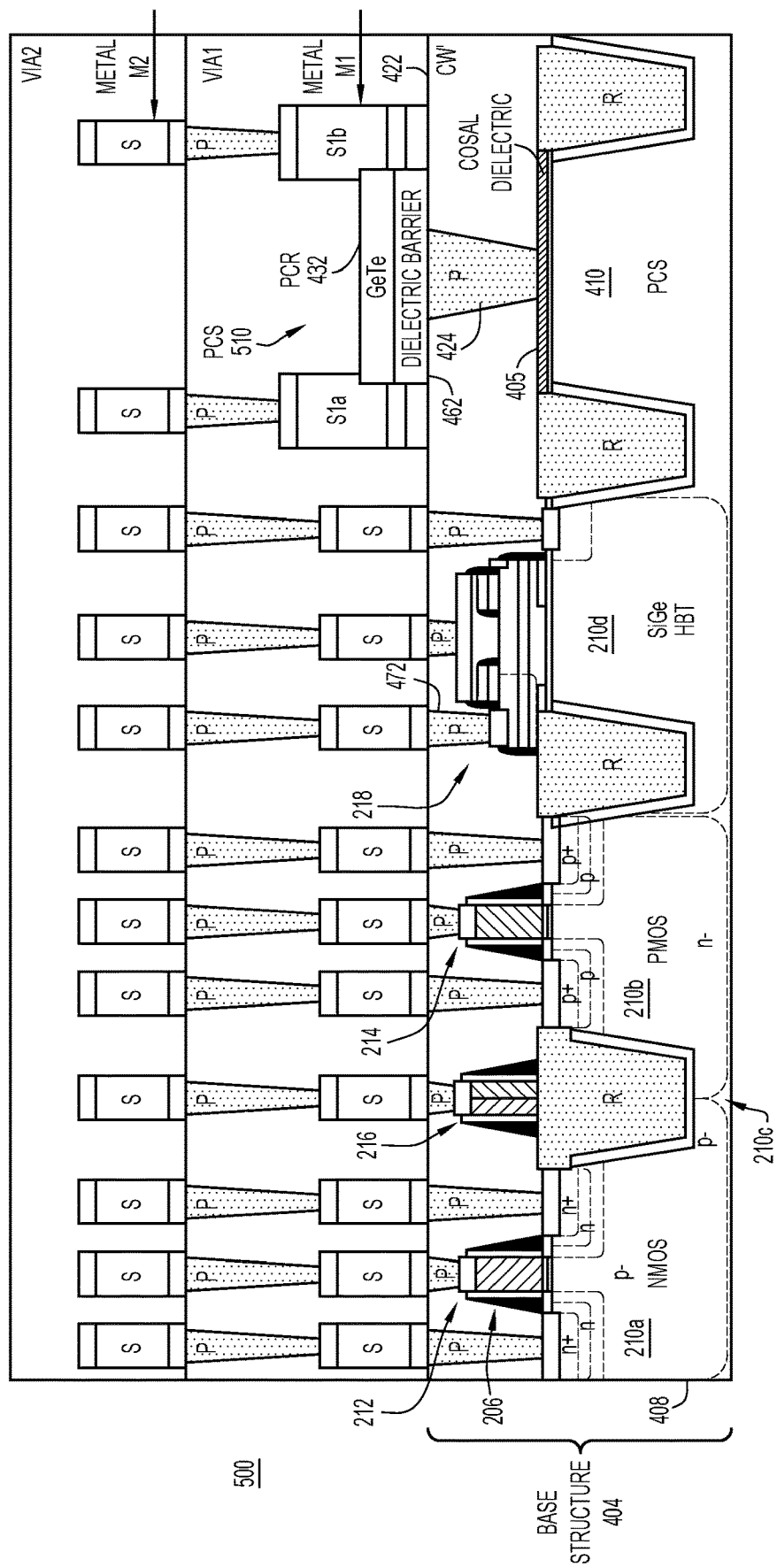
FIG. 5 is a cross-sectional view of an example structure including an example PCS, different from the PCS of FIG. 4E, that results from flow 300.

With reference to FIG. 5, there is a cross-sectional view of another example structure 500 that results from performing operations COSAL-VIA2 of flow 300 on base structure 404. Structure 500 includes base structure 404, Cosal dielectric layer 405, contact window layer CW' similar to structure 460, and a PCS 510 constructed on contact window layer CW'. PCS 510 is slightly different from PCS 468, as described below. Structure 500 also includes patterned metal layers M1, M2 and planarized dielectric layer VIA1, VIA2 alternating with the patterned metal layers formed on PCS contact window layer CW' and PCS 510. PCS 510 is similar to PCS 468, except that ohmic contacts 442a, 442b of PCS 468 are omitted from PCS 510. Instead, spaced-apart metal slabs S1a and S1b of patterned metal layer M1 directly contact spaced-apart opposing ends of PCR 432 of PCS 510.

Figure 6:
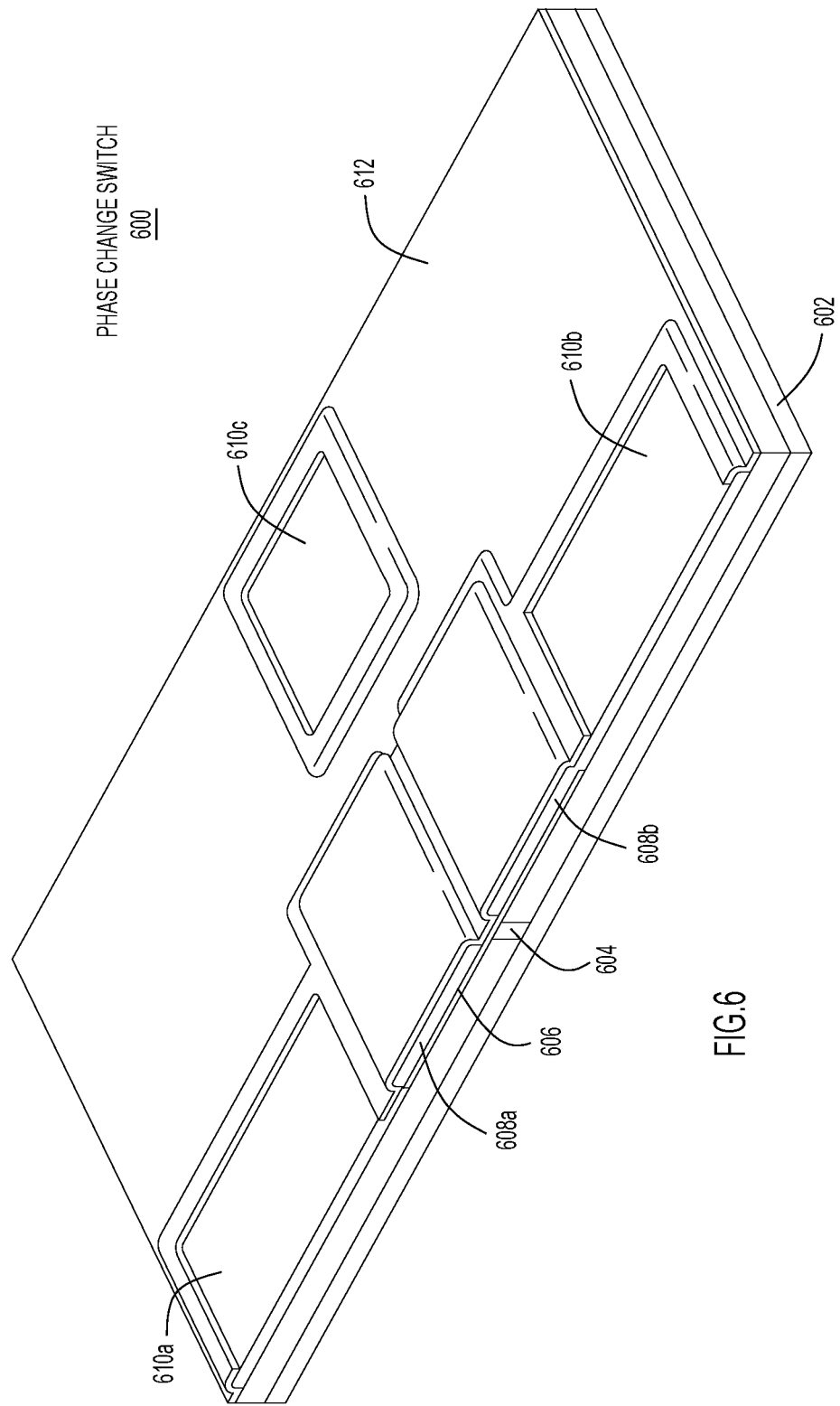
FIG. 6 is a cross-sectional perspective view of an example PCS partially integrated into a structure

With reference to FIG. 6, there is shown a cross-sectional perspective view of a PCS 600 partially integrated into a structure that includes various elements described above. PCS 600 includes a substrate 602, metal plug/heater 604 over the substrate, a dielectric barrier layer 606 over the metal plug, space-apart ohmic contacts 608a and 608b, spaced-apart metallization 610a and 610b contacting respective ones of the ohmic contacts, metallization 610c contacting the metal plug, and an overlying dielectric layer 612.

With reference to FIG. 7, there is a flowchart of an example method 700 of integrating a PCS into a BiCMOS process.

A first operation 702 includes providing a base structure including BiCMOS circuitry.

A next operation 704 includes forming on the base structure a dielectric contact window layer having metal through-plugs that contact the BiCMOS circuitry.

A next operation 706 includes constructing the PCS on the contact window layer over a PCS region of the semiconductor substrate that is adjacent to the BiCMOS circuitry. The PCS includes: a phase change region, connected between spaced-apart ohmic contacts formed on the phase change region, configured to operate as an in-line switch connected between the ohmic contacts and that is controlled by heat applied to the phase change region; and a resistive heater to generate the heat responsive to a control signal applied to the resistive heater. The constructing the PCS includes: forming in the contact window layer, over the PCS region, a metal plug configured to serve as the resistive heater; forming a dielectric barrier layer on the metal through-plug; forming the phase change region on the dielectric barrier layer; forming the spaced-apart ohmic contacts on correspondingly spaced-apart ends of the phase change region; and forming an electrically insulating spacer between the ohmic contacts. Method 700 also includes forming a dielectric layer between the metal plug and the base structure.

A next operation 708 includes forming, on the contact window layer and the PCS, a stack of alternating patterned metal layers and dielectric layers having metal through-plugs to interconnect the patterned metal layers, such that the stack connects a first one of the ohmic contacts to the BiCMOS circuitry and provides respective connections to a second one of the ohmic contacts and to the resistive heater.

In an embodiment, there are no patterned metal layers and no dielectric layers with embedded metal plugs therein between the PCS and the BiCMOS circuitry, except for the contact window layer.

In summary, in one aspect, a method of integrating a phase change switch (PCS) into a Bipolar (Bi)/Complementary Metal Oxide Semiconductor (CMOS) (BiCMOS) process is provided, comprising: providing a base structure including BiCMOS circuitry on a semiconductor substrate; forming on the base structure a dielectric contact window layer having metal through-plugs that contact the BiCMOS circuitry; constructing the PCS on the contact window layer over a PCS region of the semiconductor substrate that is adjacent to the BiCMOS circuitry, the PCS including: a phase change region, connected between spaced-apart ohmic contacts formed on the phase change region, configured to operate as an in-line switch connected between the ohmic contacts and that is controlled by heat applied to the phase change region; and a resistive heater to generate the heat responsive to a control signal applied to the resistive heater; and forming, on the contact window layer and the PCS, a stack of alternating patterned metal layers and dielectric layers having metal through-plugs to interconnect the patterned metal layers, such that the stack connects a first of the ohmic contacts to the BiCMOS circuitry and provides respective connections to a second of the ohmic contacts and to the resistive heater.

In another aspect, an apparatus in the form of an integrated circuit (IC) is provided, comprising: a base structure including Bipolar (Bi)/Complementary Metal Oxide Semiconductor (CMOS) (BiCMOS) circuitry constructed on a semiconductor substrate; a contact window layer on the base structure, the contact window layer having metal through-plugs that contact the BiCMOS circuitry; a PCS constructed on the contact window layer over a PCS region of the semiconductor substrate that is adjacent to the BiCMOS circuitry, the PCS including: a phase change region, connected between spaced-apart ohmic contacts on the phase change region, configured to operate as an in-line switch connected between the ohmic contacts and that is controlled by heat applied to the phase change region; and a resistive heater to generate the heat responsive to a control signal applied to the resistive heater; and a stack on the contact window layer and the PCS, the stack including alternating patterned metal layers and dielectric layers having metal through-plugs to interconnect the patterned metal layers, such that the stack connects a first of the ohmic contacts to the BiCMOS circuitry and provides respective connections to a second of the ohmic contacts and to the resistive heater.

In yet another aspect, a method of integrating a phase change switch (PCS) into a Bipolar (Bi)/Complementary Metal Oxide Semiconductor (CMOS) (BiCMOS) process is provided, comprising: providing a base structure including BiCMOS circuitry on a semiconductor substrate; forming on the base structure a dielectric contact window layer having metal through-plugs that contact the BiCMOS circuitry; constructing the PCS on the contact window layer over a PCS region of the semiconductor substrate that is adjacent to the BiCMOS circuitry, the constructing including: forming a metal through-plug in the contact window layer over the PCS region; forming a phase change region over the metal through-plug; forming spaced-apart ohmic contacts on the phase change region, wherein the phase change region is configured to operate as an in-line switch connected between the ohmic contacts and that is controlled by heat applied to the phase change region, and wherein the metal through-plug is configured to generate the heat responsive to a control signal applied to the metal through-plug; and forming, on the contact window layer and the PCS, a stack of alternating patterned metal layers and dielectric layers having metal through-plugs to interconnect the patterned metal layers, such that the stack connects a first of the ohmic contacts to the BiCMOS circuitry and provides respective connections to a second of the ohmic contacts and to the metal through-plug.

The above description is intended by way of example only. The description is not intended to be exhaustive nor is the invention intended to be limited to the disclosed example embodiment(s). Many modifications and variations will be apparent to those of ordinary skill in the art without departing from the scope and spirit of the invention.

What is claimed is:

1. A method of integrating a phase change switch (PCS) into a Bipolar (Bi)/Complementary Metal Oxide Semiconductor (CMOS) (BiCMOS) process, comprising:
   providing a base structure including BiCMOS circuitry on a semiconductor substrate;
   providing a dielectric layer only over a PCS region of the semiconductor substrate that is adjacent to the BiCMOS circuitry;
   forming on the base structure a contact window layer that is a dielectric and having metal through-plugs that contact the BiCMOS circuitry;
   constructing the PCS on the contact window layer over the PCS region of the semiconductor substrate, the PCS including: a phase change region, connected between ohmic contacts that are spaced-apart and formed on the phase change region, configured to operate as an in-line switch connected between the ohmic contacts and that is controlled by heat applied to the phase change region; and a resistive heater to generate the heat responsive to a control signal applied to the resistive heater; and
   forming, on the contact window layer and the PCS, a stack of alternating patterned metal layers and dielectric layers having metal through-plugs to interconnect the patterned metal layers, such that the stack connects a first of the ohmic contacts to the BiCMOS circuitry and provides respective connections to a second of the ohmic contacts and to the resistive heater.

2. The method of claim 1, wherein constructing the PCS includes:
   forming in the contact window layer, over the PCS region, a metal through-plug configured to serve as the resistive heater.

3. The method of claim 2, wherein constructing the PCS further includes:
   forming a dielectric barrier layer on the metal through-plug configured to serve as the resistive heater;
   forming the phase change region on the dielectric barrier layer; and
   forming the ohmic contacts on correspondingly spaced-apart ends of the phase change region.

4. The method of claim 2, further comprising:
   forming an insulating layer between the PCS region of the semiconductor substrate and the metal through-plug configured to serve as the resistive heater.

5. The method of claim 4, wherein constructing the PCS further includes:
   forming a passivation layer on the phase change region between the ohmic contacts.

6. The method of claim 1, wherein constructing the PCS further includes forming ohmic contacts on the resistive heater to receive the control signal, wherein forming the stack includes forming the stack to provide respective ones of the respective connections to the ohmic contacts formed on the resistive heater.

7. The method of claim 1, wherein the BiCMOS circuitry includes a heterojunction bipolar transistor (HBT) including a power terminal, a base, an emitter, and a collector, and forming the stack includes forming the stack such that the stack connects the first of the ohmic contacts to the power terminal, the base, the emitter, or the collector of the HBT.

8. The method of claim 1, wherein the contact window layer comprises Tetraethyl Orthosilicate (TEOS).

9. The method of claim 1, wherein the phase change region comprises a layer of Germanium Telluride (GeTe).

10. The method of claim 1, wherein forming the contact window layer on the base structure and forming the PCS on the contact window layer forms a structure having no patterned metal layers and no dielectric layers with embedded metal through-plugs therein between the PCS and the BiCMOS circuitry, except for the contact window layer.

11. A method of integrating a phase change switch (PCS) into a Bipolar (Bi)/Complementary Metal Oxide Semiconductor (CMOS) (BiCMOS) process, comprising:
   providing a base structure including BiCMOS circuitry on a semiconductor substrate;
   providing a dielectric layer only over a PCS region of the semiconductor substrate that is adjacent to the BiCMOS circuitry;
   forming on the base structure a contact window layer that is a dielectric and having metal through-plugs that contact the BiCMOS circuitry;
   constructing the PCS on the contact window layer over the PCS region of the semiconductor substrate that is adjacent to the BiCMOS circuitry, wherein constructing includes:
      forming a metal through-plug in the contact window layer over the PCS region;
      forming a phase change region over the metal through-plug;
      forming ohmic contacts that are spaced-apart on the phase change region, wherein the phase change region is configured to operate as an in-line switch connected between the ohmic contacts and that is controlled by heat applied to the phase change region, and wherein the metal through-plug is configured to generate the heat responsive to a control signal applied to the metal through-plug; and
   forming, on the contact window layer and the PCS, a stack of alternating patterned metal layers and dielectric layers having metal through-plugs to interconnect the patterned metal layers, such that the stack connects a first of the ohmic contacts to the BiCMOS circuitry and provides respective connections to a second of the ohmic contacts and to the metal through-plug.

* * * * *